(12) United States Patent
Seo et al.

(10) Patent No.: US 10,534,039 B2
(45) Date of Patent: Jan. 14, 2020

(54) APPARATUS AND METHOD FOR ESTIMATING DEGREE OF AGING OF SECONDARY BATTERY

(71) Applicant: LG CHEM, LTD., Seoul (KR)

(72) Inventors: Se-Wook Seo, Daejeon (KR); Yo-Han Ko, Daejeon (KR); Jin-Hyung Lim, Daejeon (KR); Yong-Seok Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 180 days.

(21) Appl. No.: 15/560,423

(22) PCT Filed: Aug. 22, 2016

(86) PCT No.: PCT/KR2016/009269
§ 371 (c)(1),
(2) Date: Sep. 21, 2017

(87) PCT Pub. No.: WO2017/034277
PCT Pub. Date: Mar. 2, 2017

(65) Prior Publication Data
US 2018/0059192 A1    Mar. 1, 2018

(30) Foreign Application Priority Data
Aug. 21, 2015    (KR) .................. 10-2015-0118136

(51) Int. Cl.
*G01R 31/392*    (2019.01)
*G01R 31/367*    (2019.01)
(Continued)

(52) U.S. Cl.
CPC ........... *G01R 31/392* (2019.01); *G01R 31/36* (2013.01); *G01R 31/367* (2019.01);
(Continued)

(58) Field of Classification Search
CPC .. G01R 31/392; G01R 31/382; G01R 31/367; G01R 31/374; G01R 31/36; H01M 10/48; H01M 10/42
See application file for complete search history.

(56) References Cited

U.S. PATENT DOCUMENTS

| 8,060,323 B2 * | 11/2011 | Taniguchi ............ G01R 31/367 702/63 |
| 2007/0285059 A1 | 12/2007 | Zettel et al. |
| 2013/0030739 A1* | 1/2013 | Takahashi ............ G01R 31/392 702/63 |
| 2013/0158915 A1* | 6/2013 | Humla ................. G01R 31/387 702/63 |

(Continued)

FOREIGN PATENT DOCUMENTS

| JP | 2013-51809 A | 3/2013 |
| JP | 2015-81823 A | 4/2015 |

(Continued)

OTHER PUBLICATIONS

International Search Report issued in PCT/KR2016/009269 (PCT/ISA210), dated Dec. 28, 2016.

*Primary Examiner* — Dominic E Hawkins
(74) *Attorney, Agent, or Firm* — Birch, Stewart, Kolasch & Birch, LLP

(57) ABSTRACT

An apparatus for estimating a degree of aging of a secondary battery is configured to: determine a current and a temperature of the secondary battery; determine a state of charge from the current of the secondary battery; determine a degree of calendar aging by applying a cumulative degree-of-aging model to a degree-of-calendar-aging profile corresponding to the determined state of charge and the determined temperature while the secondary battery is in a calendar state; determine a degree of cycle aging by applying the cumulative degree-of-aging model to a degree-of-cycle-aging profile corresponding to the state of charge, the temperature, and the current of the secondary battery while the secondary battery is in a cycle state; and determine, as the degree of aging of the secondary battery, a weighted (Continued)

average value calculated for the determined degree of calendar aging and the determined degree of cycle aging based on calendar time and cycle time.

13 Claims, 4 Drawing Sheets

(51) Int. Cl.
    *G01R 31/374*     (2019.01)
    *G01R 31/36*     (2019.01)
    *H01M 10/42*     (2006.01)
    *H01M 10/48*     (2006.01)
    *G01R 31/382*     (2019.01)

(52) U.S. Cl.
    CPC ......... *G01R 31/374* (2019.01); *G01R 31/382* (2019.01); *H01M 10/42* (2013.01); *H01M 10/48* (2013.01)

(56) References Cited

U.S. PATENT DOCUMENTS

| | | | |
|---|---|---|---|
| 2013/0166233 A1* | 6/2013 | Suh | G01R 31/3648 702/63 |
| 2014/0009123 A1 | 1/2014 | Park et al. | |
| 2014/0107956 A1* | 4/2014 | Miyaki | B60L 3/12 702/63 |
| 2014/0333265 A1* | 11/2014 | Kinjo | H02J 7/007 320/134 |
| 2016/0359203 A1* | 12/2016 | Schmiegel | H01M 10/44 |

FOREIGN PATENT DOCUMENTS

| | | |
|---|---|---|
| KR | 10-2003-0038992 A | 5/2003 |
| KR | 10-2009-0052557 A | 5/2009 |
| KR | 10-0911317 B1 | 8/2009 |
| KR | 10-1065551 B1 | 9/2011 |
| KR | 10-1293630 B1 | 8/2013 |
| KR | 10-1498760 B1 | 3/2015 |
| KR | 10-2015-0089626 A | 8/2015 |

* cited by examiner

APPARATUS AND METHOD FOR ESTIMATING DEGREE OF AGING OF SECONDARY BATTERY

TECHNICAL FIELD

The present disclosure relates to an apparatus and method for estimating a degree of aging of a secondary battery, and more particularly, to an apparatus and method for more accurately estimating a degree of aging of a secondary battery by individually integrating a change in the degree of aging while the secondary battery is in a cycle state, in which the secondary battery is charged and discharged, and a change in the degree of aging in a calendar state that is a no-load state.

The present application claims priority to Korean Patent Application No. 10-2015-0118136 filed on Aug. 21, 2015 in the Republic of Korea, the disclosure of which is incorporated herein by reference.

BACKGROUND ART

Secondary batteries generate electric energy by electrochemical oxidation and reduction reactions, and have been widely used for various purposes. For example, secondary batteries are used in gradually expanding applications including: portable devices such as mobile phones, laptop computers, digital cameras, video cameras, tablet computers, and electrically-drive tools; various electrically-driven power units such as electric bicycles, electric motorcycles, electric vehicles, hybrid vehicles, electric ships, and electric aircrafts; power storage devices used to store surplus power or power generated by new and renewable energy; uninterruptible power supplies for stably supplying power to various information communication devices including server computers and communication base stations; and the like.

Generally, a secondary battery has a structure in which an electrode assembly and an electrolyte are sealed in a packaging material and two electrode terminals having different polarities are exposed outside the packaging material. The electrode assembly includes a plurality of unit cells, and the unit cells have a structure in which a porous separator is interposed at least between a negative electrode plate and a positive electrode plate. The negative electrode plate and the positive electrode plate are coated with active materials involved in electrochemical reactions, and the secondary battery is charged or discharged by electrochemical reactions between the active materials and the electrolyte.

The capacity of a secondary battery is not continuously maintained at the capacity at beginning of life (BOL), and is reduced as a calendar time or cycle time elapses. The calendar time refers to cumulative time for which a secondary battery maintains a no-load state, and the cycle time refers to cumulative time for which a secondary battery maintains a charge or discharge state. Capacity reduction of a secondary battery may be quantitatively calculated by a degree of aging (DOA). The degree of aging may be defined by a ratio of a currently reduced amount of the capacity to the capacity at BOL. A degree of aging is a measure indicating a replacement cycle of a secondary battery. That is, since it is meant that the capacity of a secondary battery is significantly reduced if the degree of aging is above a critical value, the secondary battery needs to be replaced.

Aging of a secondary battery proceeds while the secondary battery is in a no-load state, that is, a calendar state, as well as in a charge-discharge state, that is, a cycle state. The reason is that, even though a secondary battery is in a no-load state, the capacity of the secondary battery is reduced due to reasons such as irreversible deformation of an electrolyte and an active material coated on an electrode, or an increase of the thickness of a solid electrolyte interphase (SEI) layer formed on a surface of an anode.

In addition, the aging of a secondary battery is faster in a cycle state than in a calendar state. The reason is that, when a secondary battery is in a cycle state, Joule heat is generated while a charge or discharge current flows, and that irreversible deformation of an active material and an electrolyte more quickly proceeds while operation ions (Li ions in the case of lithium batteries) are intercalated to or deintercalated from an electrode.

A degree of aging of a secondary battery may be determined by measuring the capacity of the secondary battery and calculating how much difference the measured capacity has with reference to the BOL capacity of the secondary battery.

For reference, the capacity of a secondary battery may be calculated by integrating a charge current flowing in the secondary battery while the secondary battery is charged to a state of charge (SOC) of 100% upon complete discharge of the secondary battery.

However, there are few cases in which a secondary battery is completely discharged in actual usage environments of the secondary battery, and it is difficult to accurately determine the capacity of the secondary battery due to an error of a current sensor.

Therefore, in a technical field to which the present disclosure pertains, various methods of indirectly estimating a degree of aging of a secondary battery have been developed, and one of the methods is a method using a degree-of-aging integration model.

In the degree-of-aging integration model, as shown in FIG. 1, a plurality of degree-of-aging profiles $\Delta\gamma_1(t)$, $\Delta\gamma_2(t) \ldots \Delta\gamma_n(t)$ are predefined depending upon an operation condition of a secondary battery, for example, a state of charge (SOC), a temperature, a C-rate, or the like.

In addition, in the degree-of-aging integration model, while a secondary battery is operated, an operation condition is identified and a degree-of-aging profile corresponding to the identified operation condition is selected, and while the operation condition is maintained, a change in a degree of aging of the secondary battery is determined by using the identified degree-of-aging profile. Further, in the degree-of-aging integration model, the degree of aging at a current point of time is determined by integrating the determined change in the degree of aging of the secondary battery whenever the operation condition is changed.

Referring to FIG. 1, for example, when a secondary battery, which is aged little and is in a BOL state, maintains a cycle state for a time $\Delta t_1$ under a specific operation condition and a degree-of-aging profile corresponding to the operation condition is a curve $\Delta\gamma_{n-k}(t)$, where $1 \le k \le n-1$, the degree of aging of the secondary battery increases from 0% corresponding to a point $P_0$ to $G_1\%$ corresponding to a point $P_1$ along a solid-line-marked portion of the curve $\Delta\gamma_{n-k}(t)$. That is, the degree of aging of the secondary battery is increased by $G_1\%$ for the time $\Delta t_1$.

When the time $\Delta t_1$ has elapsed, if the operation condition of the secondary battery is changed and a degree-of-aging profile corresponding to the changed operation condition is a curve $\Delta\gamma_2(t)$, the degree of aging of the secondary battery after the time $\Delta t_1$ increases along the curve $\Delta\gamma_2(t)$. However, since the degree of aging needs to consecutively increase, a position of time at which calculation of the degree of aging starts under the changed operation condition is changed from the point $P_1$ to a point $P_2$. Hereinafter, in a changed degree-of-aging profile, time that is a reference for an increase of the degree of aging, such as the point $P_2$, is referred to as reference equivalent time. If the changed operation condition is maintained for a time $\Delta t_2$, the degree of aging of the secondary battery increases from $G_1\%$ corresponding to the point $P_2$ to $G_2\%$ corresponding to a point $P_3$ along a solid-line-marked portion of the curve $\Delta\gamma_2(t)$. Therefore, the degree of aging of the secondary battery is increased by $(G_2-G_1)\%$ for the time $\Delta t_2$, and the current degree of aging is $G_2\%$ when a change in the degree of aging is integrated with the previous degree of aging of $G_1\%$.

Furthermore, when a time $\Delta t_1+\Delta t_2$ has elapsed, if the operation condition of the secondary battery is changed again and a degree-of-aging profile corresponding to the changed operation condition is a curve $\Delta\gamma_1(t)$, the degree of aging of the secondary battery increases along the curve $\Delta\gamma_1(t)$ after the time $\Delta t_1+\Delta t_2$. However, since the degree of aging needs to consecutively increase, the reference equivalent time on the curve $\Delta\gamma_1(t)$ is changed to time corresponding to a point $P_4$. If the changed operation condition is maintained for a time $\Delta t_3$, the degree of aging of the secondary battery increases from $G_2\%$ corresponding to the point $P_4$ to $G_3\%$ corresponding to a point $P_5$ along a solid-line-marked portion of the curve $\Delta\gamma_1(t)$. Therefore, the degree of aging of the secondary battery is increased by $(G_3-G_2)\%$ for the time $\Delta t_3$, and the current degree of aging is $G_3\%$ when such a change in the degree of aging is integrated with the previous degree of aging of $G_2\%$.

As such, a process of changing the degree-of-aging profile when the operation condition of the secondary battery is changed, a process of determining the reference equivalent time, which corresponds to an immediately previously integrated degree of aging, on the changed degree-of-aging profile, a process of determining an increment of the degree of aging of the secondary battery by using the changed profile while the changed operation condition is maintained, and a process of updating the degree of aging by integrating the increment of the degree of aging with the immediately previous degree of aging are continuously repeated.

However, since, in a conventional degree-of-aging integration model, a change in a degree of aging is integrated without separately distinguishing the case that a secondary battery is in a cycle state from the case that the secondary battery is in a calendar state, there is a problem of estimating the degree of aging lower than it actually is. The reason is that, since a slope change of a changed degree-of-aging profile is suddenly reduced if reference equivalent time of the changed degree-of-aging profile is suddenly increased, the change in the degree of aging is calculated to be lower than it actually is.

For example, in the example set forth above, if, when the time $\Delta t_1$ has elapsed, the operation condition of the secondary battery is changed and the degree-of-aging profile used in calculation of the degree of aging is changed from the curve $\Delta\gamma_{n-k}(t)$ to a curve $\Delta\gamma_n(t)$ having the most gentle slope, the reference equivalent time is suddenly increased to time corresponding to a point $P_6$.

The curve $\Delta\gamma_n(t)$ has a more gentle profile slope than any other curves. Therefore, even though the operation condition corresponding to the curve $\Delta\gamma_n(t)$ is maintained for a relatively long time $\Delta t_4$, since the degree of aging of the secondary battery is increased only to a degree of aging corresponding to a point $P_7$, a change in the degree of aging is significantly smaller than a change in time. Therefore, as the degree of aging is integrated by using a degree-of-aging profile having a smaller slope change, an estimation error of the degree of aging is further increased since the change in the degree of aging is calculated to be lower than it actually is.

DISCLOSURE

Technical Problem

The present disclosure is designed to solve the problems of the related art, and therefore the present disclosure is directed to providing an apparatus and method for estimating a degree of aging of a secondary battery by using an improved degree-of-aging integration model, by which accuracy of estimation of the degree of aging may be further improved compared to the related art.

Technical Solution

In one aspect of the present disclosure, there is provided an apparatus of estimating a degree of aging of a secondary battery, the apparatus including: a current measuring unit configured to measure a current of the secondary battery and output a current measurement; a temperature measuring unit configured to measure a temperature of the secondary battery and output a temperature measurement; and a control unit operatively coupled to the current measuring unit and the temperature measuring unit.

Preferably, the control unit is configured to: determine the current and the temperature of the secondary battery by receiving a current measurement signal and a temperature measurement signal respectively from the current measuring unit and the temperature measuring unit; determine a state of charge of the secondary battery from the current of the secondary battery; determine an operation state of the secondary battery as one of a calendar state and a cycle state by using the current of the secondary battery; determine a degree of calendar aging in the calendar state by applying a cumulative degree-of-aging model to a predefined degree-of-calendar-aging profile corresponding to the determined state of charge and the determined temperature while the secondary battery is in the calendar state; determine a degree of cycle aging in the cycle state by applying the cumulative degree-of-aging model to a predefined degree-of-cycle-aging profile corresponding to the state of charge, the temperature, and the current of the secondary battery while the secondary battery is in the cycle state; determine, as the degree of aging of the secondary battery, a weighted average value that is calculated for the determined degree of calendar aging and the determined degree of cycle aging on the basis of calendar time for which the calendar state is maintained and cycle time for which the cycle state is maintained.

According to one aspect of the invention, the control unit may be configured to determine a C-rate from the current of the secondary battery, determine the operation state of the secondary battery as the calendar state if the C-rate is 0, and determine the operation state of the secondary battery as the cycle state if the C-rate is not 0.

According to another aspect of the invention, the control unit may be configured to determine the state of charge of the secondary battery by integrating the current of the secondary battery.

Preferably, whenever a predetermined reference time elapses while the secondary battery is in the calendar state, the control unit may be configured to cyclically perform the following operation steps (i) to (iv):

(i) determining the predefined degree-of-calendar-aging profile used to calculate a change in the degree of calendar aging for the reference time by using the state of charge and the temperature of the secondary battery;

(ii) determining reference equivalent time on the determined degree-of-calendar-aging profile;

(iii) determining the change in the degree of calendar aging for the reference time from the reference equivalent time by using the degree-of-calendar-aging profile; and (iv) determining the degree of calendar aging of the secondary battery by integrating the determined change in the degree of calendar aging with an immediately previously determined degree of calendar aging.

Preferably, the control unit may determine, as the reference equivalent time, time corresponding to the immediately previously determined degree of calendar aging on the determined degree-of-calendar-aging profile.

Preferably, whenever a predetermined reference time elapses while the secondary battery is in a cycle state, the control unit may be configured to cyclically perform the following operation steps (i) to (iv):

(i) determining the predefined degree-of-cycle-aging profile used to calculate a change in the degree of cycle aging for the reference time by using the state of charge, the temperature, and the current of the secondary battery;

(ii) determining reference equivalent time on the determined degree-of-cycle-aging profile;

(iii) determining the change in the degree of cycle aging for the reference time from the reference equivalent time by using the degree-of-cycle-aging profile; and (iv) determining the degree of cycle aging of the secondary battery by integrating the determined change in the degree of cycle aging with an immediately previously determined degree of cycle aging.

Preferably, the control unit may be configured to determine, as the reference equivalent time, time corresponding to a degree of cycle aging determined in an immediately previous calculation cycle on the determined degree-of-cycle-aging profile.

According to one aspect of the invention, the control unit may be configured to calculate the weighted average value by respectively weighting the degree of calendar aging and the degree of cycle aging with the calendar time and the cycle time.

According to another aspect of the invention, the control unit may be configured to calculate the weighted average value by respectively weighting the degree of calendar aging and the degree of cycle aging with a log-scaled calendar time and a log-scaled cycle time.

Preferably, the apparatus according to the present disclosure may further include a memory unit operatively coupled to the control unit. In this case, the control unit may be configured to store the determined degree of aging of the secondary battery in the memory unit.

Preferably, the apparatus according to the present disclosure may further include a communication unit operatively coupled to the control unit. In this case, the control unit may be configured to output the determined degree of aging of the secondary battery to an outside of the apparatus via the communication unit.

In another aspect of the present disclosure, there is also provided a method of estimating a degree of aging of a secondary battery, the method including: (a) determining a current and a temperature of the secondary battery by using a current measuring unit and a temperature measuring unit; (b) determining a state of charge of the secondary battery from the current of the secondary battery; (c) determining an operation state of the secondary battery as one of a calendar state and a cycle state by using the current of the secondary battery; (d) determining a predefined degree-of-calendar-aging profile corresponding to the determined state of charge and the determined temperature while the secondary battery is in the calendar state, and determining a degree of calendar aging in the calendar state by applying a cumulative degree-of-aging model to the determined degree-of-calendar-aging profile; (e) determining a predefined degree-of-cycle-aging profile corresponding to the determined state of charge, the determined temperature, and the determined current of the secondary battery while the secondary battery is in the cycle state, and determining a degree of cycle aging in the cycle state by applying the cumulative degree-of-aging model to the determined degree-of-cycle-aging profile; and (f) determining, as the degree of aging of the secondary battery, a weighted average value that is calculated for the determined degree of calendar aging and the determined degree of cycle aging on the basis of calendar time for which the calendar state is maintained and cycle time for which the cycle state is maintained.

In a further aspect of the present disclosure, there is also provided a computer-readable recording medium, in which the method of estimating the degree of aging of the secondary battery according to the present disclosure is programmed and recorded.

Advantageous Effects

According to the present disclosure, when a degree of aging of a secondary battery is estimated by using a degree-of-aging integration model, the degree of aging of the secondary battery is estimated by independently calculating a change in a degree of calendar aging and a change in a degree of cycle aging, thereby allowing the degree of aging to be more accurately estimated.

In addition, according to the present disclosure, a weighted average value, which is calculated by giving a time weight to the change in the degree of calendar aging and the change in the degree of cycle aging, is determined as the degree of aging of the secondary battery, whereby an actual usage pattern of the secondary battery may be properly reflected in an increase in the degree of aging.

Further, according to the present disclosure, when the degree of aging is determined by calculating a time-weighted average for the change in the degree of calendar aging and the change in the degree of cycle aging, a log scale is applied to a time factor, whereby the accuracy of estimation of the degree of aging may be further improved.

DESCRIPTION OF DRAWINGS

The accompanying drawings illustrate an embodiment of the present disclosure and together with the following disclosure, serve to provide further understanding of the technical features of the present disclosure, and thus, the present disclosure is not construed as being limited to the drawings.

BEST MODE

Figure 1:
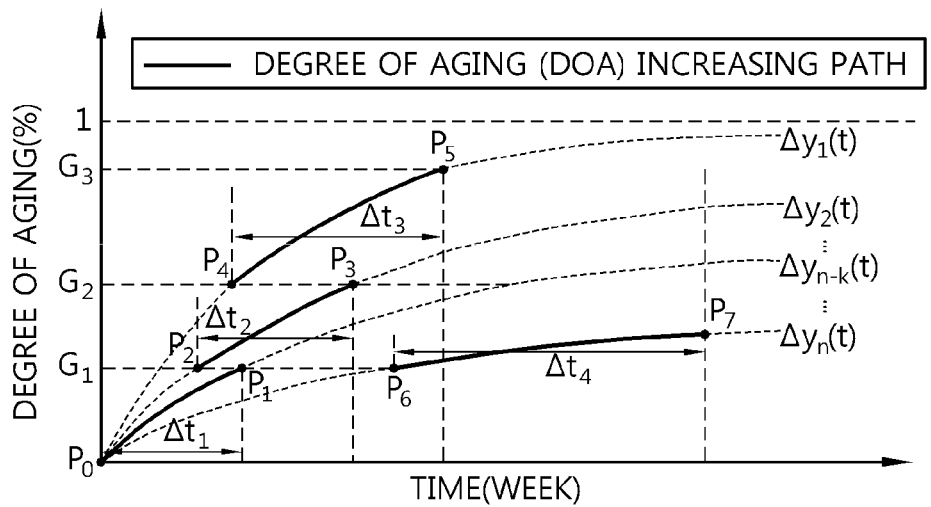
FIG. 1 is a graph depicting a path of change of a degree of aging of a secondary battery on a plurality of degree-of-aging profiles to explain a process of determining the degree of aging of the secondary battery by a conventional degree-of-aging integration model.

Hereinafter, embodiments of the present disclosure will be described in detail with reference to the accompanying drawings. Prior to the description, it should be understood that the terms used in the specification and the appended claims should not be construed as being limited to general and dictionary meanings, but interpreted based on the meanings and concepts corresponding to technical aspects of the present disclosure on the basis of the principle that the inventor is allowed to define terms appropriately for the best explanation. Therefore, since embodiments described herein and configurations shown in the drawings are merely examples and do not represent all technical aspects of the present disclosure, it should be understood that various equivalents and modifications could be made without departing from the scope of the disclosure.

Figure 2:
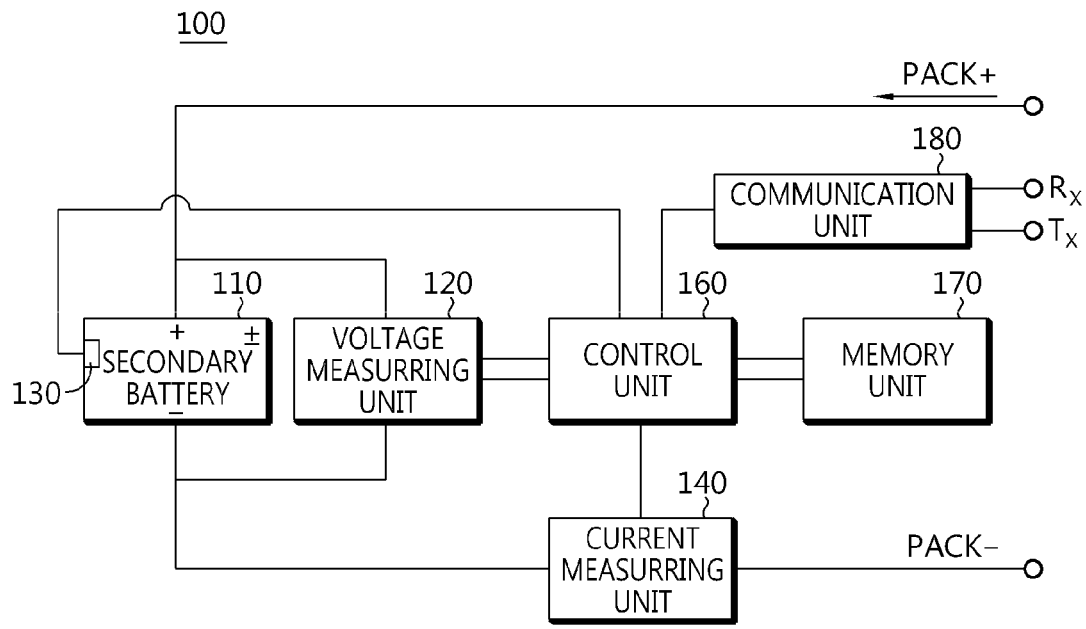
FIG. 2 is a block diagram schematically illustrating a configuration of an apparatus of estimating a degree of aging of a secondary battery, according to an embodiment of the present disclosure.

FIG. 2 is a block diagram schematically illustrating a configuration of an apparatus 100 of estimating a degree of aging of a secondary battery, according to an embodiment of the present disclosure.

Referring to FIG. 2, the apparatus 100 of estimating a degree of aging of a secondary battery, according to the present disclosure, is an apparatus coupled to a secondary battery 110 and capable of estimating a degree of aging of the secondary battery 110 according to an improved degree-of-aging integration model, and may include a voltage measuring unit 120, a temperature measuring unit 130, a current measuring unit 140, a control unit 160, and a memory unit 170.

The secondary battery 110 is a minimum unit battery allowing the degree of aging thereof to be estimated, and includes a plurality of unit cells electrically connected in series and/or in parallel. Of course, the case that the secondary battery 110 includes only one unit cell also falls within the scope of the present disclosure.

The unit cells may be any unit cells without limitation so long as the unit cells are able to be repeatedly charged and discharged. For example, the unit cells may be pouch-type lithium polymer secondary batteries.

The secondary battery 110 may be electrically coupled to various load devices via an external terminal. For example, a load device may be an electric vehicle, a hybrid vehicle, an unmanned air vehicle such as a drone, a large-capacity energy storage system (ESS) included in a power grid, or a mobile device. In this case, the secondary battery 110 may include some or all of unit cells included in a modular battery pack mounted to the load device.

The external terminal of the secondary battery 110 may be optionally coupled to a charging device. The charging device may be optionally electrically coupled to the secondary battery 110 by control of a load device to which the secondary battery 110 is mounted.

The charging device may be a charger used for charge only. In another embodiment, the charging device may be a device generating charging power in a load device to which the secondary battery 110 is mounted, for example, a generator coupled to an engine, or a regenerative charging device coupled to brakes of an automobile. The generator is coupled to a crankshaft of the engine and produces charging power when the crankshaft is rotated. In addition, the regenerative charging device produces charging power in conjunction with brakes of an automobile when the automobile is decelerated by manipulating the brakes. Since the generator and the regenerative charging device are widely known in the field of automotive technology, descriptions thereof will be omitted.

The voltage measuring unit 120, the temperature measuring unit 130, and the current measuring unit 140 cyclically measure voltage, temperature, and current of the secondary battery 110 at certain time intervals under the control of the control unit 160 and output measurement results to the control unit 160. The measurement results may be provided as analog signals or digital signals to the control unit 160. The control unit 160 may convert the analog signals into digital signals by an A/D signal conversion process.

The voltage measuring unit 120 includes a voltage measuring circuit generally used in the field of battery technology. The voltage measuring circuit may include, for example, a differential amplifier circuit that outputs a voltage signal corresponding to a voltage difference between cathode and anode terminals of the secondary battery 110. The voltage measuring unit 120 generates a voltage signal corresponding to the voltage applied between a cathode and an anode of the secondary battery 110 and outputs the voltage signal to the control unit 160.

The temperature measuring unit 130, which is a temperature sensor used for temperature measurement, may be, for example, a thermocouple. The temperature measuring unit 130 generates a voltage signal corresponding to the temperature of the secondary battery 110 and outputs the voltage signal to the control unit 160.

The current measuring unit 140, which is a sense resistor or a Hall sensor, generates voltage signals corresponding to magnitudes of a charging current and a discharging current of the secondary battery 110 and outputs the voltage signals to the control unit 160.

The control unit 160 determines each of voltage, temperature, and current values of the secondary battery 110 by signal processing when a measurement signal is input thereto from each of the measuring units 120, 130, and 140, and stores each of the values in the memory unit 170.

The memory unit 170, which is a semiconductor memory device, writes, erases, and updates data generated by the control unit 160, and stores a plurality of program codes prepared to estimate the degree of aging of the secondary battery 110. In addition, the memory unit 170 stores preset values of various predetermined parameters used in embodiments of the present disclosure. Further, the memory unit 170 may store a predefined "open-circuit voltage-state of charge lookup table" used to estimate a state of charge (SOC) of the secondary battery. The lookup table has a data structure allowing mapping a state of charge from an open-circuit voltage or, on the contrary, mapping an open-circuit voltage from a state of charge.

The memory unit 170 may be any semiconductor memory device without limitation so long as the semiconductor memory device is known as being able to write, erase, and update data. For example, the memory unit 170 may be DRAM, SDRAM, flash memory, ROM, EEPROM, a register, or the like. The memory unit 170 may further include a storage medium that stores program codes defining control logics of the control unit 160. The storage medium includes a nonvolatile memory device such as flash memory or a hard disk. The memory unit 170 may be physically separated from the control unit 160, or may be integrated with the control unit 160.

The apparatus 100 according to the present disclosure may optionally further include a communication unit 180. In this case, the control unit 160 may be operatively coupled to the communication unit 180, and may output the degree of aging estimated according to the present disclosure to an outside of the apparatus 100.

A value of the degree of aging that is output to the outside of the apparatus 100 may be received by a control computer of a load device to which the secondary battery 110 is mounted or by a diagnostic device of the secondary battery 110. The control computer or the diagnostic device may be used to determine whether or not to replace the secondary battery 110 by using the received value of the degree of aging. In addition, the control computer or the diagnostic device may visually display the received value of the degree of aging in the form of a character, a graph, or the like via a display unit by data processing. Further, the control computer or the diagnostic device may visually output a warning message via a display unit or audibly output a warning message via a speaker unit when the received value of the degree of aging is above a critical value.

The communication unit 180 may be any communication device without limitation so long as the communication device is able to transmit or receive a digital signal via a communication network external to the apparatus 100. The communication unit 180 may be a wired or wireless communication modem, and may communicate with the control computer or the diagnostic device according to a communication protocol known in the art.

The control unit 160 may estimate the degree of aging of the secondary battery 110 according to an improved degree-of-aging estimation model.

The control unit 160 independently integrates a change in the degree of aging in a calendar state of the secondary battery 110 and a change in the degree of aging in a cycle state of the secondary battery 110 and calculates weighted averages for the two changes in the degree of aging on the basis of time for which the calendar state is maintained and time for which the cycle state is maintained, thereby determining the degree of aging of the secondary battery 110.

Hereinafter, for convenience, the degree of aging integrated when the secondary battery 110 is in the calendar state is defined as a degree of calendar aging $DOA_{calendar}$. In addition, the degree of aging integrated when the secondary battery 110 is in the cycle state is defined as a degree of cycle aging $DOA_{cycle}$. In these definitions, DOA is the acronym for the term "Degree Of Aging". Further, cumulative time for which the secondary battery 110 maintains the calendar state is defined as calendar time $t_{calendar}$, and cumulative time for which the secondary battery 110 maintains the cycle state is defined as cycle time $t_{cycle}$.

More specifically, the control unit 160 determines a state of charge SOC and a temperature T of the secondary battery 110 whenever preset reference time Δt elapses, determines a degree-of-calendar-aging profile corresponding to the determined state of charge SOC and the determined temperature T, determines reference equivalent time on the determined degree-of-calendar-aging profile, and determines a change in the degree of calendar aging $\Delta DOA_{calendar}$ of the secondary battery 110 for the reference time Δt from the reference equivalent time.

In one embodiment, the degree-of-calendar-aging profile may be expressed by a function represented by the following Equation 1 according to a discrete time model.

$$DOA_{calendar}[k] = 1 - e^{(-\beta_k t^{\gamma_k})} \quad \langle\text{Equation 1}\rangle$$

wherein parameters $\beta_k$ and $\gamma_k$ are factors determining a slope of a change in the degree-of-calendar-aging profile. The degree-of-calendar-aging profile represented by Equation 1 has a shape gradually converging to 1 over time, like a conventional degree-of-aging profile shown in FIG. 1. The rate at which the profile converges to 1 varies depending upon the parameters $\beta_k$ and $\gamma_k$.

In Equation 1, each of the parameters $\beta_k$ and $\gamma_k$ is uniquely determined by the state of charge SOC and the temperature T of the secondary battery 110. The correlation of the parameter $\beta_k$ with the state of charge SOC and the temperature T may be predefined in the form of a lookup table or a function through experiments. Similarly, the correlation of the parameter $\gamma_k$ with the state of charge SOC and the temperature T may be predefined in the form of a lookup table or a function through experiments. Here, k is a time index and increases by 1 whenever the reference time Δt elapses.

In one embodiment, whenever the reference time Δt elapses, the control unit 160 determines the parameters $\beta_k$ and $\gamma_k$ corresponding to the state of charge SOC and the temperature T of the secondary battery 110 by using a predefined lookup table or function.

In addition, the control unit 160 determines reference equivalent time $\hat{t}_k$ on the degree-of-calendar-aging profile, to which the parameters $\beta_k$ and $\gamma_k$ are applied, by using the following Equation 2, the reference equivalent time $\hat{t}_k$ being a point at which calculation of the degree of aging starts.

$$\hat{t}_k = \{\ln(1 - DOA_{calendar}[k-1])/-\beta_{k-1}\}^{\frac{1}{\gamma_{k-1}}} \quad \langle\text{Equation 2}\rangle$$

wherein $DOA_{calendar}[k-1]$ is the degree of calendar aging integrated until the time index is k−1, and $\beta_{k-1}$ and $\gamma_{k-1}$ are parameters of the degree-of-calendar-aging profile, which are used to calculate a change in the degree of calendar aging when the time index is k−1.

In addition, the control unit 160 determines a change in the degree of calendar aging $\Delta DOA_{calendar}[k]$ when the state of charge SOC and the temperature T are maintained for the reference time Δt from the reference equivalent time $\hat{t}_k$, by using the following Equation 3.

$$\Delta DOA_{calendar}[k] = \left[1 - e^{-\beta_k(\hat{t}_k + \Delta t)^{\gamma_k}}\right] - \left[1 - e^{-\beta_k(\hat{t}_k)^{\gamma_k}}\right] \quad \langle\text{Equation 3}\rangle$$

In addition, the control unit 160 may determine the degree of calendar aging $DOA_{calendar}[k]$ when the time index is k by integrating $\Delta DOA_{calendar}[k]$ with $DOA_{calendar}[k-1]$.

According to another aspect of the invention, the control unit 160 may determine the state of charge SOC, the temperature T, and a C-rate of the secondary battery 110 whenever the preset reference time Δt, determine a degree-of-cycle-aging profile corresponding to the determined state of charge SOC, temperature T, and C-rate, determine a reference equivalent time on the determined degree-of-cycle-aging profile, and determine a change in the degree of cycling aging $\Delta DOA_{cycle}$ of the secondary battery 110 for the reference time Δt from the determined reference equivalent time.

In one embodiment, the degree-of-cycle-aging profile may be expressed by a function represented by the following Equation 4 according to a discrete time model.

$$DOA_{cycle} = 1 - e^{-\beta_k^* t_k^{*\gamma_k^*}} \quad \langle\text{Equation 4}\rangle$$

wherein parameters $\beta^*_k$ and $\gamma^*_k$ are factors determining a slope of a change in the degree-of-cycle-aging profile. The degree-of-cycle-aging profile represented by Equation 4 has a shape gradually converging to 1 over time, like a conventional degree-of-aging profile shown in FIG. 1. The rate at which the profile converges to 1 varies depending upon the parameters $\beta^*_k$ and $\gamma^*_k$.

In Equation 4, each of the parameters $\beta^*_k$ and $\gamma^*_k$ is uniquely determined by the state of charge SOC, the temperature T, and the C-rate of the secondary battery 110. The correlation of the parameter $\beta^*_k$ with the state of charge SOC, the temperature T, and the C-rate may be predefined in the form of a lookup table or a function through experiments. Similarly, the correlation of the parameter $\gamma^*_k$ with the state of charge SOC, the temperature T, and the C-rate may be predefined in the form of a lookup table or a function through experiments. Here, k is a time index and increases by 1 whenever the reference time Δt elapses.

In one embodiment, whenever the reference time Δt elapses, the control unit 160 determines each of the parameters $\beta^*_k$ and $\gamma^*_k$ corresponding to the state of charge SOC, the temperature T, and the C-rate of the secondary battery 110 by using a predefined lookup table or function.

In addition, the control unit 160 determines a reference equivalent time $t^*_k$, at which calculation of the degree of aging starts, on the degree-of-cycle-aging profile, to which the parameters $\beta^*_k$ and $\gamma^*_k$ are applied, by using the following Equation 5.

$$t_k^* = \{\ln(1 - DOA_{cycle}[k-1])/-\beta_{k-1}^*\}^{\frac{1}{\gamma_{k-1}^*}} \quad \langle\text{Equation 5}\rangle$$

wherein $DOA_{cycle}[k-1]$ is the degree of cycle aging integrated until the time index is k−1, and $\beta^*_{k-1}$ and $\gamma^*_{k-1}$ are parameters of the degree-of-cycle-aging profile, which are used to calculate a change in the degree of cycle aging when the time index is k−1.

In addition, the control unit 160 determines a change in the degree of cycle aging $\Delta DOA_{cycle}[k]$ when the state of charge SOC, the temperature T, and the C-rate are maintained for the reference time Δt from the reference equivalent time $t^*_k$, by using the following Equation 6.

$$\Delta DOA_{cycle}[k] = [1 - e^{-\beta_k^*(t_k^* + \Delta t)^{\gamma_k^*}}] - [1 - e^{-\beta_k^*(t_k^*)^{\gamma_k^*}}] \quad \langle\text{Equation 6}\rangle$$

In addition, the control unit 160 may determine the degree of cycle aging $DOA_{cycle}[k]$ when the time index is k by integrating $\Delta DOA_{cycle}[k]$ with $DOA_{cycle}[k-1]$.

Whenever the time Δt elapses, the control unit 160 may determine a degree of aging $DOA_{bat}$ of the secondary battery 110 by calculating a weighted average for the degree of calendar aging $DOA_{calendar}[k]$ and the degree of cycle aging $DOA_{cycle}[k]$ on the basis of calendar time $t_{calendar}$ and cycle time $t_{cycle}$ by using the following Equation 7 or 8.

$$DOA_{bat} = \frac{DOA_{calendar}[k] \times t_{calendar} + DOA_{cycle}[k] \times t_{cycle}}{t_{calendar} + t_{cycle}} \quad \langle\text{Equation 7}\rangle$$

$$DOA_{bat} = \frac{DOA_{calendar}[k] \times \log(t_{calendar}) + DOA_{cycle}[k] \times \log(t_{cycle})}{\log(t_{calendar}) + \log(t_{cycle})} \quad \langle\text{Equation 8}\rangle$$

When Equation 7 is compared with Equation 8, Equation 8 has a difference in that a log scale is applied to the calendar time $t_{calendar}$ and the cycle time $t_{cycle}$. As such, when a log scale is applied to time, the accuracy of the degree of aging may be further improved. This will be described through experimental examples.

The control unit 160 may optionally include a processor, an application-specific integrated circuit (ASIC), another chipset, a logic circuit, a register, a communication modem, a data processing device, or the like, which is known in the art, in order to execute the control logics set forth above.

In addition, when the control logics are realized as software, the control unit 160 may be realized as a set of program modules. Here, each program module may be stored in memory and executed by a computer processor. The memory may be inside or outside the processor, and may be connected to the processor by various well-known computer components. Further, the memory may be included in the memory unit 170 according to the present disclosure. Furthermore, the memory collectively refers to devices storing information regardless of kinds of devices rather than refers to a specific memory device.

At least one of various control logics of the control unit 160 may be combined, and the combined control logics may be written in a computer-readable code system and recorded on a computer-readable recording medium. The recording medium may be any recording medium without limitation so long as the recording medium is able to be accessed by a processor included in a computer. For example, the recording medium includes at least one selected from the group including ROM, RAM, a register, CD-ROM, a magnetic tape, a hard disk, a floppy disk, and an optical data recording device. In addition, the code system may be modulated with a carrier signal and included in a communication carrier at a specific time point, and may be dispersively stored in computers connected by a network and executed. Further, functional programs, codes, and code segments for realizing the combined control logics may be easily inferred by programmers in a technical field to which the present disclosure pertains.

The control unit 160 may be a battery management system (BMS) capable of being electrically coupled to the secondary battery 110, or a control element included in the battery management system.

Although the battery management system may mean a system referred to as BMS in a technical field to which the present disclosure pertains, any system performing at least one function described in the present disclosure in a functional perspective may be included in the scope of the battery management system.

Hereinafter, the flow of control logic, in which the control unit 160 determines the degree of aging of the secondary battery 110 by using an improved degree-of-aging integration model, will be described in detail with reference to the flowchart of FIGS. 3 and 4.

Figure 3:
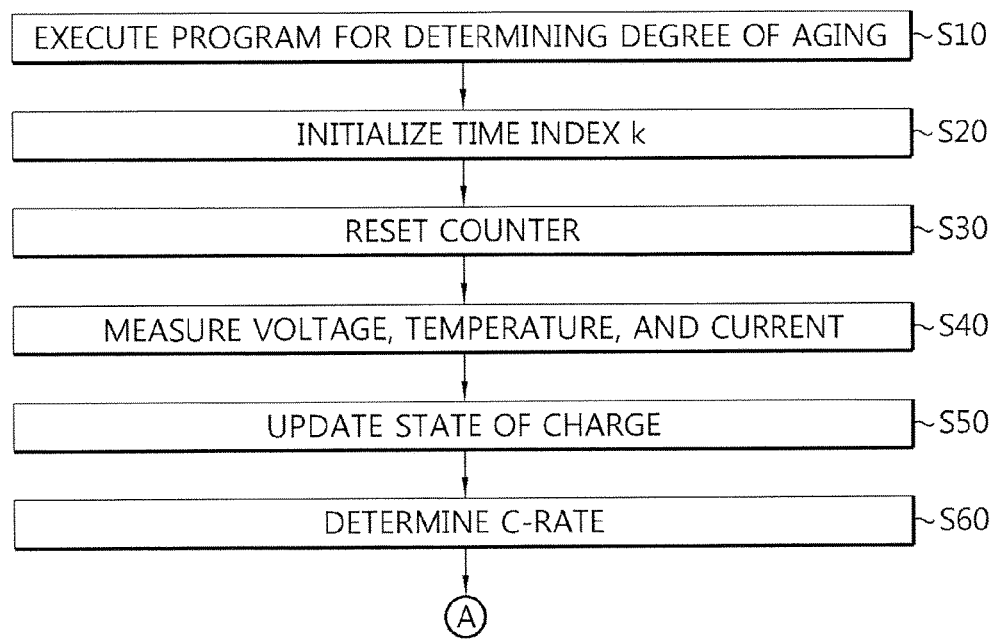
FIGS. 3 and 4 show a flowchart illustrating a method of estimating a degree of aging of a secondary battery, according to an embodiment of the present disclosure.
Figure 4:
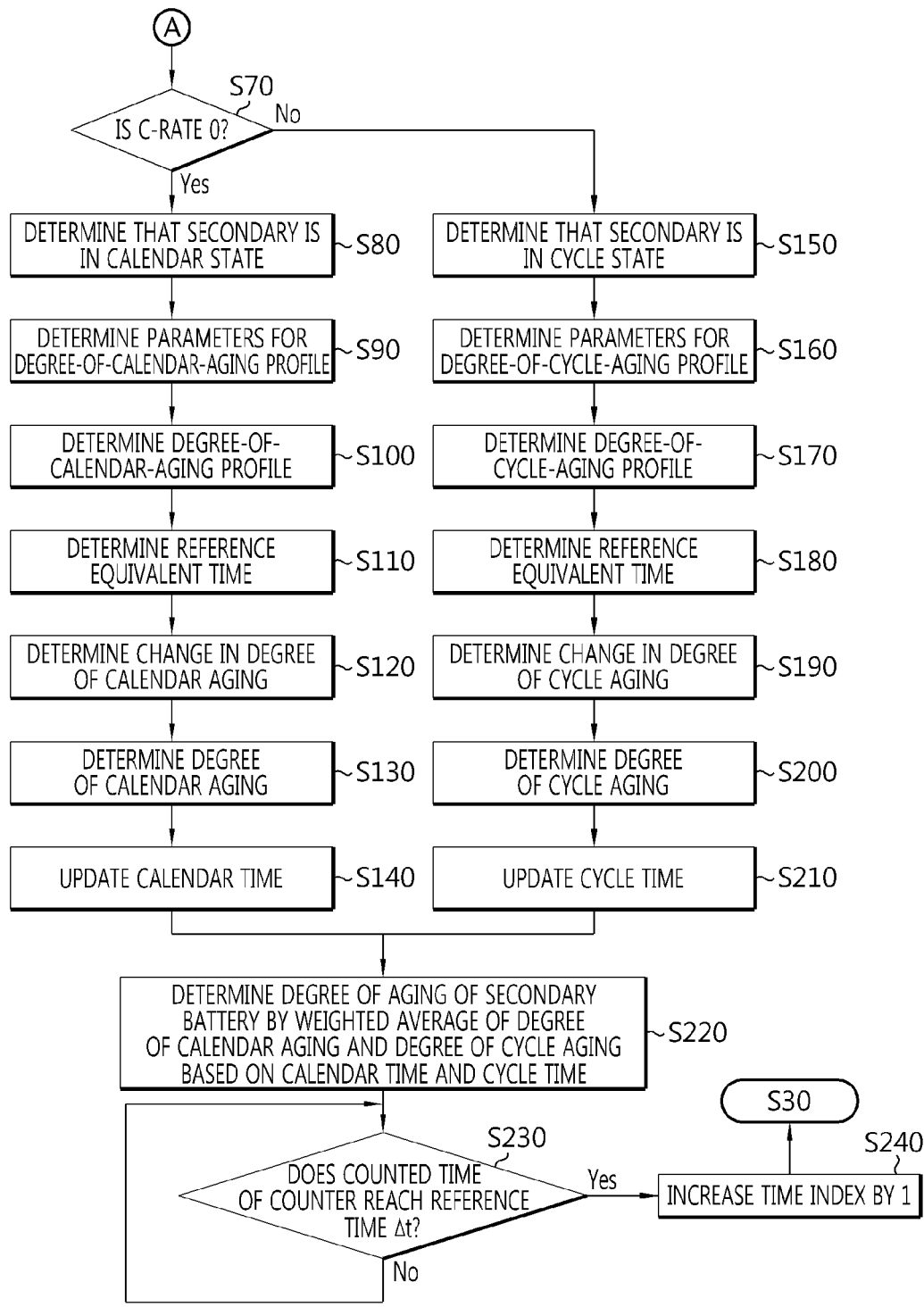

As shown in FIGS. 3 and 4, first, to determine the degree of aging of the secondary battery 110 according to the improved degree-of-aging integration model, the control unit 160 executes a program code for calculating the degree of aging (S10).

Next, the control unit 160 initializes a time index k to 1 (S20), and resets a counter that counts time (S30). When the counter is reset, the counter starts to count time again from 0 seconds.

Next, the control unit 160 measures a voltage $V_k$, a temperature $T_k$, and a current $I_k$ of the secondary battery 110 by controlling the voltage measuring unit 120, the temperature measuring unit 130, and the current measuring unit 140, and stores the measured values of voltage, temperature, and current to the memory unit 170 (S40).

Next, the control unit 160 updates a state of charge $SOC_k$ of the secondary battery 110 by a current integration method by using the value of current $I_k$ currently measured (S50). The current integration method is a method of updating the state of charge of the secondary battery 110 by integrating a charge current and a discharge current of the secondary battery 110 over time by using the following Equation 9.

$SOC_k = SOC_{k-1} + \Delta t * I_k / Q_{bat}$  <Equation 9> wherein $\Delta t$ is time for which the current flows and corresponds to a reference time allowing the algorithm of FIGS. 3 and 4 to be repeated, and $Q_{bat}$ is the capacity of the secondary battery 110. $I_k$ is the measured value of current of the secondary battery 110, and has a positive value during charge of the secondary battery 110 and, on the contrary, a negative value during discharge of the secondary battery 110.

The control unit 160 determines the state of charge corresponding to an open-circuit voltage, which is measured before the secondary battery 110 starts to be charged or discharged, from an "open-circuit voltage-state of charge lookup table" prerecorded in the memory unit 170, and assigns the determined value of the state of charge as a value of $SOC_0$ to be stored in the memory unit 170. In this way, if the state of charge is initialized, the control unit 160 may cyclically determine the state of charge $SOC_k$ by using Equation 9 whenever the charge current or the discharge current is measured after the initialization. A process of determining the $SOC_0$ may be performed independently from the algorithm of FIGS. 3 and 4.

The control unit 160 may also update the state of charge $SOC_k$ of the secondary battery 110 by a recursive algorithm such as an extended Kalman filter, in addition to the current integration method, and the present disclosure is not limited by a specific method of determining the state of charge. When the extended Kalman filter is used in determining the state of charge of the secondary battery, the voltage $V_k$, the temperature $T_k$, and the current $I_k$ of the secondary battery, which have been measured in operation step step S40, may be used.

Next, the control unit 160 determines a C-rate $C_k$ of the secondary battery 110 by using the value of current $I_k$ measured in operation step step S40 (S60). That is, the control unit 160 may determine the C-rate $C_k$ by dividing the measured value of current $I_k$ (Ampere) by the capacity (Ah) of the secondary battery 110.

After operation S60, the control unit 160 determines whether the C-rate $C_k$ is 0 (S70).

If the C-rate $C_k$ is determined to be 0, the control unit 160 determines that the secondary battery 110 is in a calendar state (S80).

In this case, to determine the change in the degree of calendar aging $\Delta DOA_{calendar}[k]$, the control unit 160 determines the parameters $\beta_k$ and $\gamma_k$ of the degree-of-calendar-aging profile (see Equation 1) with reference to the temperature $T_k$ and the state of charge $SOC_k$ of the secondary battery 110 stored in the memory unit 170 (S90).

Here, a method of determining the parameters $\beta_k$ and $\gamma_k$ by using a predefined correlation (lookup table or function) between each of the temperature $T_k$ and the state of charge $SOC_k$ of the secondary battery 110 and the parameters $\beta_k$ and $\gamma_k$ has been already described.

Next, the control unit 160 determines the degree-of-calendar-aging profile as follows by applying the parameters $\beta_k$ and $\gamma_k$ determined in operation step S90 to Equation 1 described above, the degree-of-calendar-aging profile being used to calculate the change in the degree of calendar aging $\Delta DOA_{calendar}[k]$ (S100).

$$DOA_{calendar}[k] = 1 - e^{-\beta_k t^{\gamma_k}}$$

Next, the control unit 160 determines the reference equivalent time $\hat{t}_k$ as follows by using the determined degree-of-calendar-aging profile and Equation 2 described above (S110).

$$\hat{t}_k = \{\ln(1 - DOA_{calendar}[k-1])/-\beta_{k-1}\}^{\frac{1}{\gamma_{k-1}}}$$

wherein $\beta_{k-1}$ and $\gamma_{k-1}$ are determined in the previous calculation cycle, and values thereof when the time index k is 1, that is, $\beta_0$ and $\gamma_0$ may be determined by values of the state of charge and the temperature, which are measured before the algorithm of FIGS. 3 and 4 starts, and be initialized.

$DOA_{calendar}[0]$ when the time index k is 1 means the degree of aging when the secondary battery 110 is not substantially aged. Therefore, as an initialization condition for $DOA_{calendar}[0]$, 0 or a value approximate to 0 may be set as an initialization value.

In addition, under the assumption that the state of charge $SOC_k$ and the temperature $T_k$ determined in the current calculation cycle are maintained for the reference time $\Delta t$ from the reference equivalent time $\hat{t}_k$ determined in operation step S110, the control unit 160 determines the change in the degree of calendar aging $\Delta DOA_{calendar}[k]$ as follows by using the degree-of-calendar-aging profile determined in operation step S100 and Equation 3 (S120).

$$\Delta DOA_{calendar}[k] = \left[1 - e^{-\beta_k (\hat{t}_k + \Delta t)^{\gamma_k}}\right] - \left[1 - e^{-\beta_k (\hat{t}_k)^{\gamma_k}}\right]$$

Next, the control unit 160 determines the degree of calendar aging $DOA_{calendar}[k]$ at the time index k by integrating the change in the degree of calendar aging $\Delta DOA_{calendar}[k]$ determined in operation step S120 with $DOA_{calendar}[k-1]$ (S130).

Since the current time index is 1, $DOA_{calendar}[k-1]$ is $DOA_{calendar}[0]$ that is an initialization value, $\Delta DOA_{calendar}[k]$ is $\Delta DOA_{calendar}[1]$, and $DOA_{calendar}[k]$ is $DOA_{calendar}[1]$.

Next, the control unit 160 updates the calendar time $t_{calendar}$ by integrating the reference time $\Delta t$, the calendar time $t_{calendar}$ corresponding to cumulative time for which the calendar state is maintained (S140).

If a process is branched in operation step S70 and operation steps S80 to S140 are performed, the degree of cycle aging $DOA_{cycle}[k]$ and the cycle time $t_{cycle}$ are not updated (increased).

On the other hand, in operation step S70, if the C-rate $C_k$ is determined not to be 0, a process of updating the degree of cycle aging $DOA_{cycle}[k]$ and the cycle time $t_{cycle}$ is performed.

Specifically, if the C-rate $C_k$ is determined not to be 0 in operation step S70, the control unit 160 determines that the secondary battery 110 is in a cycle state (S150).

In this case, to determine a change in the degree of aging in the cycle state, that is, the change in the degree of cycle aging $\Delta DOA_{cycle}[k]$, the control unit 160 determines the parameters $\beta^*_k$ and $\gamma^*_k$ of the degree-of-cycle-aging profile (see Equation 4) with reference to the temperature $T_k$, the state of charge $SOC_k$, and the C-rate $C_k$ of the secondary battery 110 stored in the memory unit 170 (S160). Here, a method of determining the parameters $\beta^*_k$ and $\gamma^*_k$ by using a predefined correlation between each of the temperature $T_k$, the state of charge $SOC_k$, and the C-rate $C_k$ of the secondary battery 110 and the parameters $\beta^*_k$ and $\gamma^*_k$ has been already described.

Next, the control unit 160 determines the degree-of-cycle-aging profile as follows by applying the parameters $\beta^*_k$ and $\gamma^*_k$ determined in operation step S160 to Equation 4 described above, the degree-of-cycle-aging profile being used to calculate the change in the degree of cycle aging $\Delta DOA_{cycle}[k]$ (S170).

$$DOA_{cycle} = 1 - e^{-\beta^*_k t^{*\gamma^*_k}_k}$$

In addition, the control unit 160 determines the reference equivalent time $t^*_k$ as follows by using Equation 5 described above, the reference equivalent time $t^*_k$ being a reference point for calculation of the change in the degree of cycle aging $\Delta DOA_{cycle}[k]$ (S180).

$$t^*_k = \{\ln(1 - DOA_{cycle}[k-1])/-\beta^*_{k-1}\}^{\frac{1}{\gamma^*_{k-1}}}$$

wherein $\beta^*_{k-1}$ and $\gamma^*_{k-1}$ are determined in the previous calculation cycle, and values thereof when the time index k is 1, that is, $\beta^*_0$ and $\gamma^*_0$ are may be determined by values of the state of charge, the temperature, and the C-rate, which are predetermined before the algorithm of FIGS. 3 and 4 starts, and be initialized.

$DOA_{cycle}[0]$ when the time index k is 1 means the degree of aging when the secondary battery 110 is not substantially aged. Therefore, as an initialization condition for $DOA_{cycle}[0]$, 0 or a value approximate to 0 may be set as an initialization value.

In addition, under the assumption that the state of charge $SOC_k$, the temperature $T_k$, and the C-rate $C_k$ determined in the current calculation cycle are maintained for the reference time $\Delta t$ from the reference equivalent time $t^*_k$ determined in operation step S180, the control unit 160 determines the change in the degree of cycle aging $\Delta DOA_{cycle}[k]$ as follows by using the degree-of-cycle-aging profile determined in operation step S170 and Equation 6 (S190).

$$\Delta DOA_{cycle}[k] = [1 - e^{-\beta^*_k (t^*_k + \Delta t)\gamma^*_k}] - [1 - e^{-\beta^*_k (t^*_k)\gamma^*_k}]$$

Next, the control unit 160 determines the degree of cycle aging $DOA_{cycle}[k]$ at the time index k by integrating the change in the degree of cycle aging $\Delta DOA_{cycle}[k]$ determined in operation step S190 with $DOA_{cycle}[k-1]$ (S200).

Since the current time index is 1, $DOA_{cycle}[k-1]$ is $DOA_{cycle}[0]$ that is an initialization value, $\Delta DOA_{cycle}[k]$ is $\Delta DOA_{cycle}[1]$, and $DOA_{cycle}[k]$ is $DOA_{cycle}[1]$.

Next, the control unit 160 updates the cycle time $t_{cycle}$ by integrating the reference time $\Delta t$, the cycle time $t_{cycle}$ corresponding to cumulative time for which the cycle state is maintained (S210).

If a process is branched in operation step S70 and operation steps S150 to S210 are performed, the degree of calendar aging $DOA_{calendar}[k]$ and the calendar time $t_{calendar}$ are not updated (increased).

When the degree of calendar aging $DOA_{calendar}[k]$ and the degree of cycle aging $DOA_{cycle}[k]$ are determined through the processes described above, the control unit 160 determines the degree of aging of the secondary battery 110 on the basis of the current time index k.

That is, the control unit 160 calculates a weighted average value for the degree of calendar aging $DOA_{calendar}[k]$ and the degree of cycle aging $DOA_{cycle}[k]$ on the basis of the calendar time $t_{calendar}$ and the cycle time t and determines the weighted average value as the degree of aging $DOA_{bat}$ of the secondary battery 110 (S220).

Although the weighted average value for the degree of calendar aging $DOA_{calendar}[k]$ and the degree of cycle aging $DOA_{cycle}[k]$ may be calculated by one of the following equations, the latter calculation method has higher accuracy than the former calculation method.

$$DOA_{bat} = \frac{DOA_{calendar}[k] \times t_{calendar} + DOA_{cycle}[k] \times t_{cycle}}{t_{calendar} + t_{cycle}}$$

$$DOA_{bat} = \frac{DOA_{calendar}[k] \times \log(t_{calendar}) + DOA_{cycle}[k] \times \log(t_{cycle})}{\log(t_{calendar}) + \log(t_{cycle})}$$

After the control unit 160 determines the degree of aging $DOA_{bat}$ of the secondary battery 110 on the basis of the current time index, operation S230 is performed.

In operation step S230, the control unit 160 determines whether time counted by the counter reaches the reference time $\Delta t$. Here, $\Delta t$ substantially corresponds to an update cycle for the degree of aging of the secondary battery 110.

If the counted time of the counter is less than the reference time $\Delta t$, a process does not proceed and is put on hold, and if the counted time of the counter reaches the reference time $\Delta t$, operation step S240 is performed.

In operation step S240, the control unit 160 increases the time index k by 1, and allows the process to return to operation S30 again. Therefore, the processes set forth above are continuously repeated whenever the time index k is increased by 1.

That is, when the time index is k+1, either the degree of calendar aging $DOA_{calendar}[k+1]$ and the calendar time $t_{calendar}$ or the degree of cycle aging $DOA_{cycle}[k+1]$ and the cycle time $t_{cycle}$ are selectively updated, and the degree of aging $DOA_{bat}$ of the secondary battery 110 may be cyclically updated by the weighted average calculation formula.

Although not shown in the drawings, the control unit 160 may match measured values and calculated values, which are generated due to repetition of the algorithm, to time indices and store the values and time indices as matched in the memory unit 170.

In addition, the control unit 160 may select at least one of the measured and calculated values cumulatively stored and read the at least one value from the memory unit 170, and then, may transmit the at least one value to a control computer of a load device or to a diagnostic device diagnosing the secondary battery 110.

In particular, the control unit 160 may read, from the memory unit 170, values of the degree of aging of the secondary battery 110 among the calculated values generated in the process of performing the algorithm, and transmit the read values to the control computer of the load device or to the diagnostic device diagnosing the secondary battery 110 via the communication unit 180.

The control computer or the diagnostic device may manage a replacement cycle of the secondary battery 110 by using the values of the degree of aging received via the communication unit 180.

For example, the control computer or the diagnostic device may visually display, on a display unit such as a liquid crystal display, a most recently calculated value of the degree of aging of the secondary battery 110 in the form of a character, number, or graph.

In addition, if a most recently determined value of the degree of aging of the secondary battery 110 is above a critical value, the control computer or the diagnostic device may generate a warning message and visually or audibly output the information that the secondary battery 110 needs to be checked to a user of the load device or an operator diagnosing the secondary battery 110 via a display unit or a speaker unit.

Experimental Example

Hereinafter, effects of the present disclosure will be described by way of experimental examples. Since the experimental examples described herein are for helping understanding of the present disclosure, it is obvious that the scope of the present disclosure is not limited by the experimental examples.

First, a pouch-type lithium polymer secondary battery, which had a capacity of 52 Ah and a state of charge of 95% and was not substantially aged, was prepared.

Next, the prepared secondary battery was mounted to a charge-discharge simulator which simulates charge and discharge of the secondary battery mounted in a hybrid vehicle.

In addition, the apparatus of estimating the degree of aging according to the present disclosure was coupled to the secondary battery, and a program developed to estimate the degree of aging was installed in the apparatus.

After completion of preparation for experiment, a charge-discharge profile according to urban driving (Miami) conditions, which were used as automotive standards of USA, was input to the charge-discharge simulator, and the secondary battery was charged and discharged for 40 weeks. The charge-discharge profile intermittently included an idle period in addition to a charge period and a discharge period. In the idle period, charge and discharge of the secondary battery were substantially stopped. Therefore, the calendar state of the secondary battery was simulated by using the idle period.

When the degree of aging of the secondary battery was to be determined by using the developed program while an experiment was performed, the reference time Δt was set as 1 seconds. Therefore, in this experiment, the degree of aging of the secondary battery was determined substantially at intervals of 1 second. The degree of aging was determined under different calculation conditions by separately applying the weighted average formulae of Equations 7 and 8.

Parameters of the degree-of-aging profile were determined every second by using a pre-defined function.

A function for determining the parameters $\beta_k$ and $\gamma_k$ of the degree-of-calendar-aging profile was configured to include the state of charge SOC and the temperature T of the secondary battery as input variables.

The shape of the function for determining the parameters $\beta_k$ and $\gamma_k$ was optimized through trial and error such that the degree-of-calendar-aging profile properly followed the shape of change of the actual degree of aging of the secondary battery when the secondary battery was in the calendar state.

Similarly, a function for determining the parameters $\beta^*_k$ and $\gamma^*_k$ of the degree-of-cycle-aging profile was configured to include the state of charge SOC, the temperature T, and the C-rate of the secondary battery as input variables.

The shape of the function for determining the parameters $\beta^*_k$ and $\gamma^*_k$ was optimized through trial and error such that the degree-of-cycle-aging profile properly followed the shape of change of the actual degree of aging of the secondary battery when the secondary battery was in charge and discharge cycles.

Experimental Results

Figure 5:
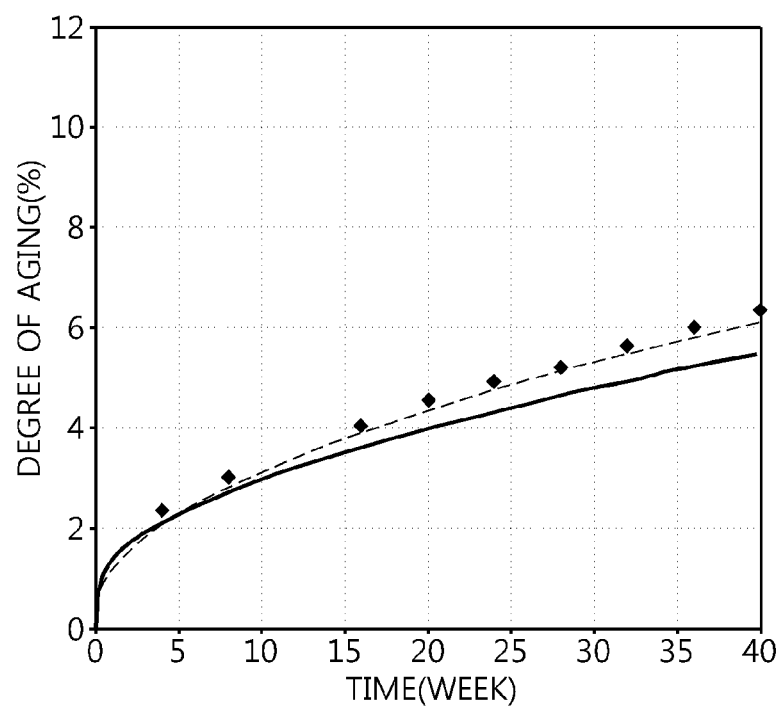
FIG. 5 is a graph showing comparison of a pattern of change of a degree of aging estimated according to the present disclosure with a pattern of change of an actual degree of aging.

FIG. 5 is a graph depicting the change of the degree of aging determined at intervals of 1 second in this experiment, together with the change of the actual degree of aging of the secondary battery.

In FIG. 5, the graph plotted by ♦ shows change over time for the actual degree of aging of the secondary battery. In addition, the solid-line graph shows change over time for the degree of aging in the case of using the weighted average formula of Equation 7 when the degree of aging of the secondary battery is determined according to the present disclosure. Further, the dashed-line graph shows change over time for the degree of aging in the case of using the weighted average formula of Equation 8 when the degree of aging of the secondary battery is determined according to the present disclosure.

Referring to FIG. 5, it was confirmed that both of the solid-line and dashed-line graphs properly followed the actual change of the degree of aging. In addition, it could be seen that the dashed-line graph more properly followed the actual change of the degree of aging than the solid-line graph, and this was resulted from applying a log scale to the time factor upon calculation of the weighted average. If the log scale is applied to the time factor, a problem of calculation of a change in the degree of aging to be lower than it actually is may be mitigated in a time period in which the slope of a change in the degree-of-aging profile is extremely small.

As a result of applying a conventional degree-of-aging integration model while the charge-discharge experiment was performed for 40 weeks, the degree of aging calculated by the conventional degree-of-aging integration model was about 3.58% lower than the degree of aging estimated according to the present disclosure.

The reason is that, since the degree of calendar aging and the degree of cycle aging were not independently integrated in the conventional degree-of-aging integration model, as shown in FIG. 1, when the reference equivalent time is abruptly moved to a time region in which the slope of a change in the degree of aging is significantly small, a change in the degree of aging with respect to a change in time is calculated to be lower than it actually is.

On the other hand, according to the present disclosure, the degree of aging is individually calculated by separating the calendar state, in which an increase in the degree of aging is relatively slow, from the cycle state, in which an increase in the degree of aging is relatively quick. Therefore, when the change in the degree of aging is calculated by using each degree-of-aging profile, an abrupt increase in the reference equivalent time may be prevented, and as a result, an error caused by an abrupt change in the reference equivalent time may be mitigated.

In addition, according to the present disclosure, since the degree of aging of the secondary battery is determined as the weighted average value of the degree of calendar aging and the degree of cycle aging, the degree of aging may be estimated so as to be suitable for actual aging status of the secondary battery.

The above experimental results support that the degree-of-aging integration model according to the present disclosure has higher reliability and can more accurately estimate the degree of aging of the secondary battery than the conventional model.

It should be understood that, when various embodiments of the present disclosure are described, components referred to as '~unit' are functionally divided elements rather than physically divided elements. Therefore, each component may be selectively integrated with another component, or may be divided into sub-components to efficiently execute control logic(s). However, it is obvious to one of ordinary skill in the art that, if identity of function may be acknowledged even though components are integrated or divided, integrated or divided components are also to be construed as falling within the scope of the disclosure.

Although the present disclosure has been described in detail with reference to some embodiments in conjunction with the accompanying drawings, it should be understood that the present disclosure is not limited by the foregoing embodiments, and that various modifications and changes can be made by one of ordinary skill in the art without departing from the scope of the disclosure.

INDUSTRIAL APPLICABILITY

According to the present disclosure, when a degree of aging of a secondary battery is estimated by using a degree-of-aging integration model, the degree of aging of the secondary battery is estimated by independently calculating a change in a degree of calendar aging and a change in a degree of cycle aging, thereby allowing the degree of aging to be more accurately estimated.

In addition, according to the present disclosure, a weighted average value, which is calculated by giving a time weight to the change in the degree of calendar aging and the change in the degree of cycle aging, is determined as the degree of aging of the secondary battery, whereby an actual usage pattern of the secondary battery may be properly reflected in an increase in the degree of aging.

Further, according to the present disclosure, when the degree of aging is determined by calculating a time-weighted average for the change in the degree of calendar aging and the change in the degree of cycle aging, a log scale is applied to a time factor, whereby the accuracy of estimation of the degree of aging may be further improved.

What is claimed is:

1. An apparatus of estimating a degree of aging of a secondary battery, the apparatus comprising:
a current measuring unit configured to measure a current of the secondary battery and output a current measurement;
a temperature measuring unit configured to measure a temperature of the secondary battery and output a temperature measurement; and
a control unit operatively coupled to the current measuring unit and the temperature measuring unit,
wherein the control unit is configured to:
determine the current and the temperature of the secondary battery by receiving a current measurement signal and a temperature measurement signal respectively from the current measuring unit and the temperature measuring unit;
determine a state of charge of the secondary battery from the current of the secondary battery;
determine an operation state of the secondary battery as one of a calendar state and a cycle state by using the current of the secondary battery;
determine a degree of calendar aging in the calendar state by applying a cumulative degree-of-aging model to a predefined degree-of-calendar-aging profile corresponding to the determined state of charge and the determined temperature while the secondary battery is in the calendar state;
determine a degree of cycle aging in a cycle state by applying the cumulative degree-of-aging model to a predefined degree-of-cycle-aging profile corresponding to the state of charge, the temperature, and the current of the secondary battery while the secondary battery is in the cycle state; and
determine, as the degree of aging of the secondary battery, a weighted average value that is calculated for the determined degree of calendar aging and the determined degree of cycle aging on the basis of calendar time for which the calendar state is maintained and cycle time for which the cycle state is maintained, and
wherein, whenever a predetermined reference time elapses while the secondary battery is in the cycle state, the control unit is configured to perform:
(i) determining the predefined degree-of-cycle profile used to calculate a change in the degree of cycle aging for the reference time by using the state of charge, the temperature, and the current of the secondary battery;
(ii) determining a reference equivalent time on the determined degree-of-cycle-aging profile;
(iii) determining the change in the degree of cycle aging for the reference time from the reference equivalent time by using the degree-of-cycle-aging profile; and
(iv) determining the degree of cycle aging of the secondary battery by integrating the determined change in the degree of cycle aging with a previously determined degree of cycle aging.

2. The apparatus according to claim 1, wherein, whenever a predetermined reference time elapses while the secondary battery is in the calendar state, the control unit is configured to cyclically perform: (i) determining the predefined degree-of-calendar-aging profile used to calculate a change in the degree of calendar aging for the reference time by using the state of charge and the temperature of the secondary battery; (ii) determining a reference equivalent time on the determined degree-of-calendar-aging profile; (iii) determining the change in the degree of calendar aging for the reference time from the reference equivalent time by using the degree-of-calendar-aging profile; and (iv) determining the degree of calendar aging of the secondary battery by integrating the determined change in the degree of calendar aging with a previously determined degree of calendar aging.

3. The apparatus according to claim 2, wherein the control unit is configured to determine, as the reference equivalent time, time corresponding to the previously determined degree of calendar aging on the determined degree-of-calendar-aging profile.

4. The apparatus according to claim 1, wherein the control unit is configured to determine, as the reference equivalent time, time corresponding to the previously determined degree of cycle aging on the determined degree-of-cycle-aging profile.

5. The apparatus according to claim 1, wherein the control unit is configured to: calculate the weighted average value by respectively weighting the degree of calendar aging and the degree of cycle aging with the calendar time and the cycle time; or calculate the weighted average value by respectively weighting the degree of calendar aging and the degree of cycle aging with a log-scaled calendar time and a log-scaled cycle time.

6. The apparatus according to claim 1, further comprising a memory unit operatively coupled to the control unit,
wherein the control unit is configured to store the determined degree of aging of the secondary battery in the memory unit.

7. The apparatus according to claim 1, further comprising a communication unit operatively coupled to the control unit,
wherein the control unit is configured to output the determined degree of aging of the secondary battery to an outside of the apparatus via the communication unit.

8. A method of estimating a degree of aging of a secondary battery, the method comprising:
(a) determining a current and a temperature of the secondary battery by using a current measuring unit and a temperature measuring unit;
(b) determining a state of charge of the secondary battery from the current of the secondary battery;
(c) determining an operation state of the secondary battery as one of a calendar state and a cycle state by using the current of the secondary battery;
(d) determining a predefined degree-of-calendar-aging profile corresponding to the determined state of charge and the determined temperature while the secondary battery is in the calendar state, and determining a degree of calendar aging in the calendar state by applying a cumulative degree-of-aging model to the determined degree-of-calendar-aging profile;
(e) determining a predefined degree-of-cycle-aging profile corresponding to the determined state of charge, the determined temperature, and the determined current of the secondary battery while the secondary battery is in the cycle state, and determining a degree of cycle aging in the cycle state by applying the cumulative degree-of-aging model to the determined degree-of-cycle-aging profile; and
(f) determining, as the degree of aging of the secondary battery, a weighted average value that is calculated for the determined degree of calendar aging and the determined degree of cycle aging on the basis of calendar time for which the calendar state is maintained and cycle time for which the cycle state is maintained, wherein the operation step (e) comprises cyclically updating the degree of cycle aging by repeatedly performing operation steps (e1) to (e4) of:
(e1) determining the predefined degree-of-cycle-aging profile used to calculate a change in the degree of cycle aging for reference time by using the state of charge, the temperature, and the current of the secondary battery;
(e2) determining reference equivalent time on the determined degree-of-cycle-aging profile;
(e3) determining the change in the degree of cycle aging for the reference time from the reference equivalent time by using the degree-of-cycle-aging profile; and
(e4) determining the degree of cycle aging of the secondary battery by integrating the determined change in the degree of cycle aging.

9. The method according to claim 8, wherein the operation step (d) comprises cyclically updating the degree of calendar aging by repeatedly performing operation steps (d1) to (d4) of:
(d1) determining the predefined degree-of-calendar-aging profile used to calculate a change in the degree of calendar aging for reference time by using the state of charge and the temperature of the secondary battery;
(d2) determining reference equivalent time on the determined degree-of-calendar-aging profile;
(d3) determining the change in the degree of calendar aging for the reference time from the reference equivalent time by using the degree-of-calendar-aging profile; and
(d4) determining the degree of calendar aging of the secondary battery by integrating the determined change in the degree of calendar aging.

10. The method according to claim 9, wherein the operation step (d2) comprises determining, as the reference equivalent time, time corresponding to the degree of calendar aging determined in an immediately previous calculation cycle on the determined degree-of-calendar-aging profile.

11. The method according to claim 8, wherein the operation step (e2) comprises determining, as the reference equivalent time, time corresponding to the degree of cycle aging determined in an immediately previous calculation cycle on the determined degree-of-cycle-aging profile.

12. The method according to claim 8, wherein, in the operation step (f),
the weighted average value is calculated by respectively weighting the degree of calendar aging and the degree of cycle aging with the calendar time and the cycle time, or
the weighted average value is calculated by respectively weighting the degree of calendar aging and the degree of cycle aging with a log-scaled calendar time and a log-scaled cycle time.

13. The method according to claim 8, after the operation step (e), further comprising:
storing the determined degree of aging of the secondary battery in a memory unit, or
outputting the determined degree of aging of the secondary battery to an outside via a communication unit.

* * * * *